US008081404B2

(12) United States Patent
Ibusuki et al.

(10) Patent No.: US 8,081,404 B2
(45) Date of Patent: Dec. 20, 2011

(54) MAGNETORESISTIVE ELEMENT INCLUDING AN AMORPHOUS REFERENCE LAYER, A CRYSTAL LAYER, AND A PINNED LAYER

(75) Inventors: Takahiro Ibusuki, Isehara (JP); Shinjiro Umehara, Kawasaki (JP); Masashige Sato, Atsugi (JP)

(73) Assignee: Fujitsu Limited, Kawasaki (JP)

( * ) Notice: Subject to any disclaimer, the term of this patent is extended or adjusted under 35 U.S.C. 154(b) by 341 days.

(21) Appl. No.: 12/548,990

(22) Filed: Aug. 27, 2009

(65) Prior Publication Data

US 2010/0053824 A1  Mar. 4, 2010

(30) Foreign Application Priority Data

Sep. 4, 2008  (JP) .................................. 2008-226864

(51) Int. Cl.
*G11B 5/39* (2006.01)
(52) U.S. Cl. ................................. 360/324.12; 360/324.2
(58) Field of Classification Search ............... 360/324.1, 360/324.11, 324.12, 324.2
See application file for complete search history.

(56) References Cited

U.S. PATENT DOCUMENTS

| 2006/0056115 A1* | 3/2006 | Djayaprawira et al. .... 360/324.2 |
| 2007/0139827 A1* | 6/2007 | Gao et al. ................... 360/324.2 |
| 2007/0253118 A1 | 11/2007 | Hayakawa et al. |
| 2008/0074805 A1 | 3/2008 | Ikarashi et al. |
| 2008/0124581 A1* | 5/2008 | Miura et al. ................ 428/811.1 |
| 2008/0174921 A1 | 7/2008 | Ikarashi et al. |
| 2009/0027810 A1* | 1/2009 | Horng et al. ................ 360/324.2 |
| 2009/0108383 A1* | 4/2009 | Horng et al. ................... 257/421 |
| 2010/0019333 A1* | 1/2010 | Zhao et al. ..................... 257/427 |

FOREIGN PATENT DOCUMENTS

| JP | 2007-294737 | 11/2007 |
| JP | 2008-103661 | 5/2008 |

* cited by examiner

*Primary Examiner* — Jefferson Evans
(74) *Attorney, Agent, or Firm* — Greer, Burns & Crain, Ltd.

(57) ABSTRACT

A magnetoresistive element includes: a free layer made of a ferromagnetic material, the free layer configured to change the direction of magnetization under the influence of an external magnetic field; an insulating layer overlaid on the free layer, the insulating layer made of an insulating material; an amorphous reference layer overlaid on the insulating layer, the amorphous reference layer made of a ferromagnetic material, the amorphous reference layer configured to fix the magnetization in a predetermined direction; a crystal layer overlaid on the amorphous reference layer, the crystal layer containing crystal grains; a non-magnetic layer overlaid on the crystal layer, the non-magnetic layer containing crystal grains having grown from the crystal grains in the crystal layer; and a pinned layer overlaid on the non-magnetic layer, the pinned layer configured to fix the magnetization in a predetermined direction.

7 Claims, 7 Drawing Sheets

MAGNETORESISTIVE ELEMENT INCLUDING AN AMORPHOUS REFERENCE LAYER, A CRYSTAL LAYER, AND A PINNED LAYER

CROSS-REFERENCE TO RELATED APPLICATION

This application is based upon and claims the benefit of priority from the prior Japanese Patent Application No. 2008-226864 filed on Sep. 4, 2008, the entire contents of which are incorporated herein by reference.

FIELD

The embodiments discussed herein are related to a magnetoresistive element.

BACKGROUND

A tunnel-junction magnetoresistive (TuMR) element includes a fixed magnetization layer and a free layer. The fixed magnetization layer is configured to fix the direction of magnetization even under the influence of an external magnetic field. The free layer is configured to change the direction of magnetization under the influence of an external magnetic field. The fixed magnetization layer includes a pinned layer, a reference layer and a non-magnetic layer sandwiched between the pinned layer and the reference layer. A tunnel barrier layer is sandwiched between the fixed magnetization layer and the free layer. The magnetoresistance of the tunnel-junction magnetoresistive element changes depending on a relative angle between the direction of the magnetization of the fixed magnetization layer and that of the free layer. Variation in the magnetoresistance is utilized to discriminate binary data.

The tunnel-junction magnetoresistive element has a so-called bottom type multilayered structure. The fixed magnetization layer is received on an antiferromagnetic layer in the bottom type multilayered structure. The antiferromagnetic layer is made of IrMn (iridium manganese), for example. The IrMn layer tends to suffer from unevenness of a relatively large scale on the surface based on crystal grains. The unevenness of the antiferromagnetic layer affects the tunnel barrier layer through the pinned layer, the non-magnetic layer and the reference layer formed on the antiferromagnetic layer. This results in deterioration in magnetic interaction established between the free layer and the reference layer.

Publication 1: IP Patent Application Laid-open No. 2007-294737
Publication 2: IP Patent Application Laid-open No. 2008-103661

A so-called top type multilayered structure is proposed for the tunnel-junction magnetoresistive element to eliminate such deterioration. The top type multilayered structure includes a free layer, a tunnel barrier layer, a reference layer, a non-magnetic layer, a pinned layer and an antiferromagnetic layer overlaid on one another in this sequence. The antiferromagnetic layer is layered in the tunnel-junction magnetoresistive element after the establishment of the tunnel barrier layer. The tunnel barrier layer is thus released from the effect of the unevenness of the antiferromagnetic layer. However, the top type multilayered structure inevitably suffers from a reduction in a resistance to the external magnetic field. As a result, variation in the magnetoresistance becomes small. Sensitivity deteriorates for reading binary data.

SUMMARY

According to an aspect of the invention, a magnetoresistive element includes: a free layer made of a ferromagnetic material, the free layer configured to change the direction of magnetization under the influence of an external magnetic field; an insulating layer overlaid on the free layer, the insulating layer made of an insulating material; an amorphous reference layer overlaid on the insulating layer, the amorphous reference layer made of a ferromagnetic material, the amorphous reference layer configured to fix the magnetization in a predetermined direction; a crystal layer overlaid on the amorphous reference layer, the crystal layer containing crystal grains; a non-magnetic layer overlaid on the crystal layer, the non-magnetic layer containing crystal grains having grown from the crystal grains in the crystal layer; and a pinned layer overlaid on the non-magnetic layer, the pinned layer configured to fix the magnetization in a predetermined direction.

The object and advantages of the embodiment will be realized and attained by means of the elements and combinations particularly pointed out in the appended claims. It is to be understood that both the foregoing general description and the following detailed description are exemplary and explanatory and are not restrictive of the embodiment, as claimed.

DESCRIPTION OF EMBODIMENT

Embodiments of the present invention will be explained below with reference to the accompanying drawings.

Figure 1:
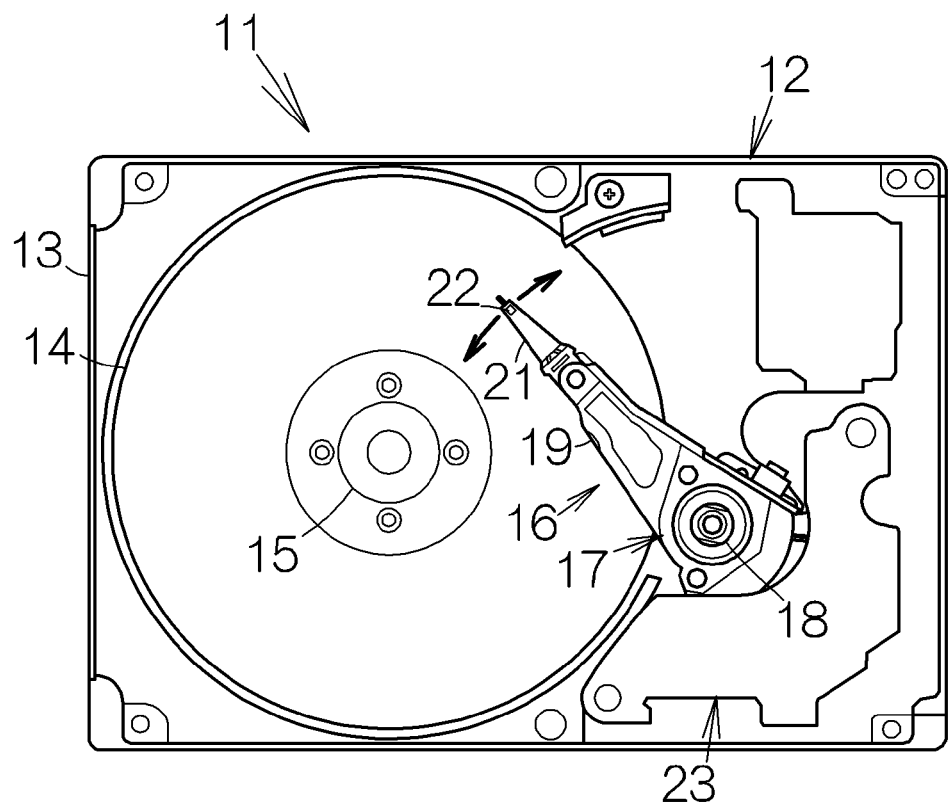
FIG. 1 is a plan view schematically depicting the inner structure of a hard disk drive as a specific example of a storage apparatus.

FIG. 1 schematically depicts the inner structure of a hard disk drive, HDD, 11 as an example of a storage medium drive or storage apparatus. The hard disk drive 11 includes an enclosure 12. The enclosure 12 includes a box-shaped enclosure base 13 and an enclosure cover, not depicted. The box-shaped enclosure base 13 defines an inner space in the shape of a flat parallelepiped, for example. The enclosure base 13 may be made of a metallic material such as aluminum, for example. Molding process may be employed to form the enclosure base 13. The enclosure cover is coupled to the enclosure base 13. The enclosure cover closes the opening of the enclosure base 13. Pressing process may be employed to form the enclosure cover out of a plate material, for example.

At least one magnetic recording disk 14 as a storage medium is placed in the inner space of the enclosure base 13. The magnetic recording disk or disks 14 are mounted on the spindle or driving shaft of a spindle motor 15. The spindle motor 15 drives the magnetic recording disk or disks 14 at a higher revolution speed such as 4,200 rpm, 5,400 rpm, 7,200 rpm, 10,000 rpm, 15,000 rpm, or the like. Here, the individual magnetic recording disk 14 is a perpendicular magnetic recording medium, for example. Specifically, the axis of easy magnetization in a magnetic recording film on the magnetic recording disk 14 is aligned in the vertical direction perpendicular to the surface of the magnetic recording disk 14.

A carriage 16 is also placed in the inner space of the enclosure base 13. The carriage 16 includes a carriage block 17. The carriage block 17 is supported on a vertical pivot shaft 18 for relative rotation. Carriage arms 19 are defined in the carriage block 17. The carriage arms 19 extend in the horizontal direction from the vertical pivot shaft 18. The carriage block 17 may be made of aluminum, for example. Extrusion molding process may be employed to form the carriage block 17, for example. The carriage block 17 may be made of a metallic material such as aluminum, for example.

A head suspension 21 is attached to the front or tip end of the individual carriage arm 19. The head suspension 21 extends forward from the carriage arm 19. A flexure is attached to the head suspension 21. A gimbal is defined in the flexure at the front or tip end of the head suspension 21. A magnetic head slider or flying head slider 22 is supported on the gimbal. The gimbal allows the flying head slider 22 to change its attitude relative to the head suspension 21. A head element or electromagnetic transducer is mounted on the flying head slider 22 as described later in detail.

When the magnetic recording disk 14 rotates, the flying head slider 22 is allowed to receive airflow generated along the rotating magnetic recording disk 14. The airflow serves to generate a positive pressure or a lift as well as a negative pressure on the flying head slider 22. The lift is balanced with the urging force of the head suspension 21 and the negative pressure so that the flying head slider 22 is allowed to keep flying above the surface of the magnetic recording disk 14 during the rotation of the magnetic recording disk 14 at a higher stability.

A power source such as a voice coil motor, VCM, 23 is coupled to the carriage block 17. The voice coil motor 23 serves to drive the carriage block 17 around the vertical pivot shaft 18. The rotation of the carriage block 17 allows the carriage arms 19 and the head suspensions 21 to swing. When the carriage arm 19 swings around the vertical pivot shaft 18 during the flight of the flying head slider 22, the flying head slider 22 is allowed to move on an arc defined in the radial direction of the magnetic recording disk 14. The electromagnetic transducer on the flying head slider 22 is thus allowed to cross the data zone between the innermost and outermost recording tracks. The electromagnetic transducer on the flying head slider 22 is positioned right above a target recording track on the magnetic recording disk 14.

Figure 2:
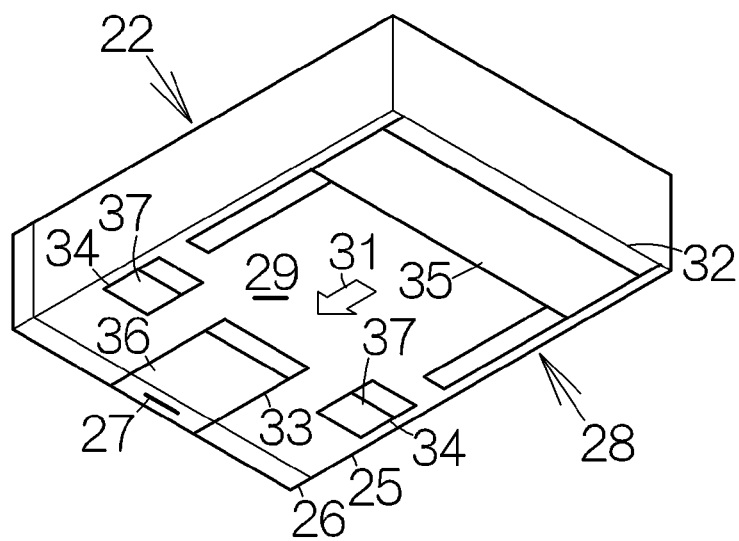
FIG. 2 is an enlarged perspective view schematically depicting a flying head slider according to a specific example.

FIG. 2 depicts the flying head slider 22 according to an example. The flying head slider 22 includes a base or a slider body 25 in the form of a flat parallelepiped, for example. An insulating non-magnetic film, namely a head protection film 26, is overlaid on the outflow or trailing end surface of the slider body 25. The electromagnetic transducer 27 is incorporated in the head protection film 26. The electromagnetic transducer 27 will be described later in detail.

The slider body 25 is made of a hard non-magnetic material such as $Al_2O_3$—TiC. The head protection film 26 is made of a relatively soft material such as $Al_2O_3$ (alumina). The slider body 25 defines a medium-opposed surface, namely a bottom surface 28, opposed to the magnetic recording disk 14 at a distance. A flat base surface 29 as a reference surface is formed on the bottom surface 28. When the magnetic recording disk 14 rotates, airflow 31 flows along the bottom surface 28 from the inflow or front end of the slider body 25 to the outflow or rear end of the slider body 25.

A front rail 32 is formed on the bottom surface 28 of the slider body 25. The front rail 32 stands upright from the base surface 29 of the bottom surface 28 at a position near the leading end of the slider body 25. The front rail 32 extends along the inflow edge of the base surface 29 in the lateral direction of the slider body 25. A rear center rail 33 is likewise formed on the bottom surface 28 of the slider body 25. The rear center rail 33 stands upright from the base surface 29 of the bottom surface 28 at a position near the trailing end of the slider body 25. The rear center rail 33 is placed at the intermediate position in the lateral direction of the slider body 25. The rear center rail 33 extends to reach the head protection film 26. A pair of rear side rails 34, 34 are likewise formed on the bottom surface 28 of the slider body 25. The rear side rails 34, 34 stand upright from the base surface 29 of the bottom surface 28 at positions near the trailing end of the slider body 25, respectively. The rear side rails 34, 34 are placed along the side edges of the slider body 25, respectively. The rear center rail 33 is placed in a space between the rear side rails 34, 34.

Air bearing surfaces 35, 36, 37, 37 are formed on the top surfaces of the front rail 32, the rear center rail 33 and the rear side rails 34, 34, respectively. Steps are formed to connect the inflow edges of the air bearing surfaces 35, 36, 37, 37 to the top surfaces of the front rail 32, the rear center rail 33 and the rear side rails 34, respectively. When the bottom surface 28 of the flying head slider 22 receives the airflow 31, the steps generate a relatively larger positive pressure or lift at the air bearing surfaces 35, 36, 37, respectively. Additionally, a larger negative pressure is generated behind the front rail 32 or at a position downstream of the front rail 32. The negative pressure is balanced with the lift so as to stabilize the flying attitude of the flying head slider 22. As a matter of course, the flying head slider 22 can take any other shape or form different from the aforementioned one.

The electromagnetic transducer 27 is embedded in the rear center rail 33 at a position downstream of the air bearing surface 36. The electromagnetic transducer 27 includes a read element and a write element, for example. A tunnel-junction magnetoresistive (TuMR) element is employed as the read element. The electric resistance of the read head changes in response to the inversion of the magnetic flux exerted from the magnetic recording disk 14. The discrimination of binary data can be achieved through detection of the change in this electric resistance. A so-called single pole head is employed as the write element. The single pole head utilizes a thin film coil pattern for generation of a magnetic field. The generated magnetic field is utilized to write data into the magnetic recording disk 14. The electromagnetic transducer 27 allows the read element and the write element to respectively expose the read gap and the write gap at the surface of the head protection film 26. A hard protection film may be formed on the surface of the head protection film 26 at a position downstream of the air bearing surface 36. Such a hard protection film covers over the write gap and the read gap exposed at the surface of the head protection film 26. The protection film may be made of a diamond like carbon (DLC) film, for example.

Figure 3:
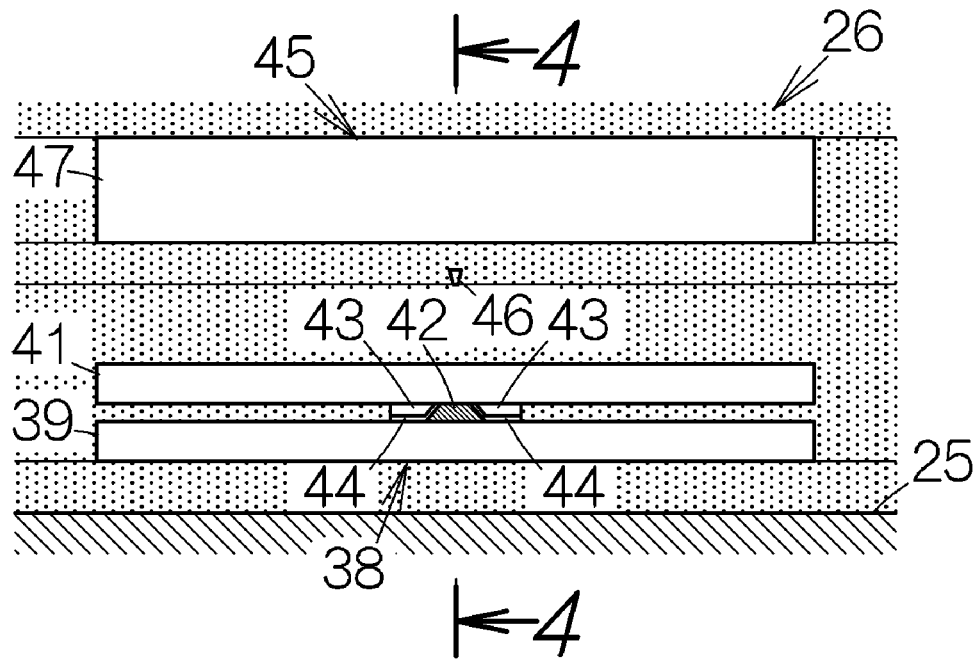
FIG. 3 is a front view schematically depicting an electromagnetic transducer observed at a bottom surface of the flying head slider.

As depicted in FIG. 3, the read element 38 includes a tunnel-junction magnetoresistive film 42 sandwiched between a pair of electrically-conductive layers, namely a lower electrode 39 and an upper electrode 41. The lower electrode 39 and the upper electrode 41 may be made of a material having a high magnetic permeability such as FeN (iron nitride), NiFe (nickel iron), NiFeB (nickel iron boron) or CoFeB (cobalt iron boron). The thicknesses of the lower electrode 39 and the upper electrode 41 are set in a range between 2.0 μm and 3.0 μm, for example. The lower electrode 39 and the upper electrode 41 function as a lower shielding layer and an upper shielding layer, respectively. A gap between the lower and upper electrodes 39, 41 serves to determine a linear resolution of magnetic recordation on the magnetic recording disk 14 along the recording track.

A pair of magnetic domain controlling films 43 is placed between the upper electrode 41 and the lower electrode 39. The tunnel-junction magnetoresistive film 42 is interposed between the magnetic domain controlling films 43 along the bottom surface 28. The magnetic domain controlling films 43 may be made of a hard magnetic material such as CoCrPt (cobalt chromium platinum alloy), for example. The magnetic domain controlling films 43 are magnetized in a specific single direction along the bottom surface 28. An insulating film 44 is formed between each of the magnetic domain controlling films 43 and the lower electrode 39 as well as between each of the magnetic domain controlling films 43 and the tunnel-junction magnetoresistive film 42. The insulating film 44 is made of $Al_2O_3$, for example. The thickness of the insulating film 44 may be set in a range from 3.0 nm to 10.0 nm, for example. The insulating film 44 serves to insulate the magnetic domain controlling films 43 from the lower electrode 39 and the tunnel-junction magnetoresistive film 42. Consequently, even if the magnetic domain controlling films 43 have electrical conductivity, electrical connection is established between the upper electrode 41 and the lower electrode 39 only through the tunnel-junction magnetoresistive film 42.

Figure 4:
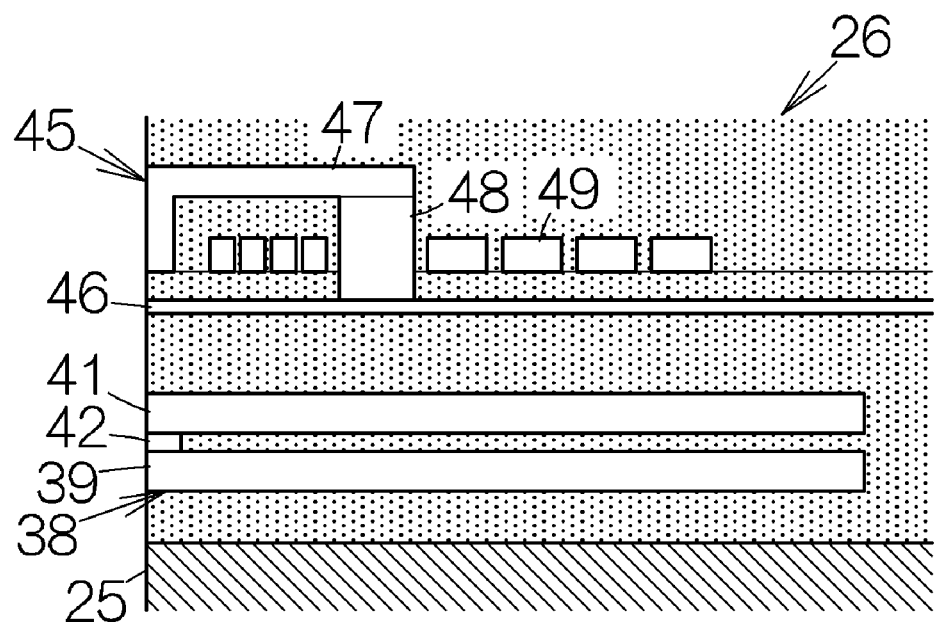
FIG. 4 is a sectional view taken along the line 4-4 in FIG. 3.

The write element 45, namely the single pole head, includes a main magnetic pole 46 and an auxiliary magnetic pole 47, exposed on the surface of the rear center rail 33. The main magnetic pole 46 and the auxiliary magnetic pole 47 may be made of a magnetic material such as FeN, NiFe, NiFeB or CoFeB. Referring also to FIG. 4, a magnetic connecting piece 48 connects the rear end of the auxiliary magnetic pole 47 to the main magnetic pole 46. A magnetic coil, namely a thin film coil pattern 49, is formed in a swirly pattern around the magnetic connecting piece 48. The main magnetic pole 46, the auxiliary magnetic pole 47 and the magnetic connecting piece 48 in combination establish a magnetic core which penetrates through the center of the thin film coil pattern 49. Note that FIG. 4 is a sectional view taken along the line 4-4 in FIG. 3.

Figure 5:
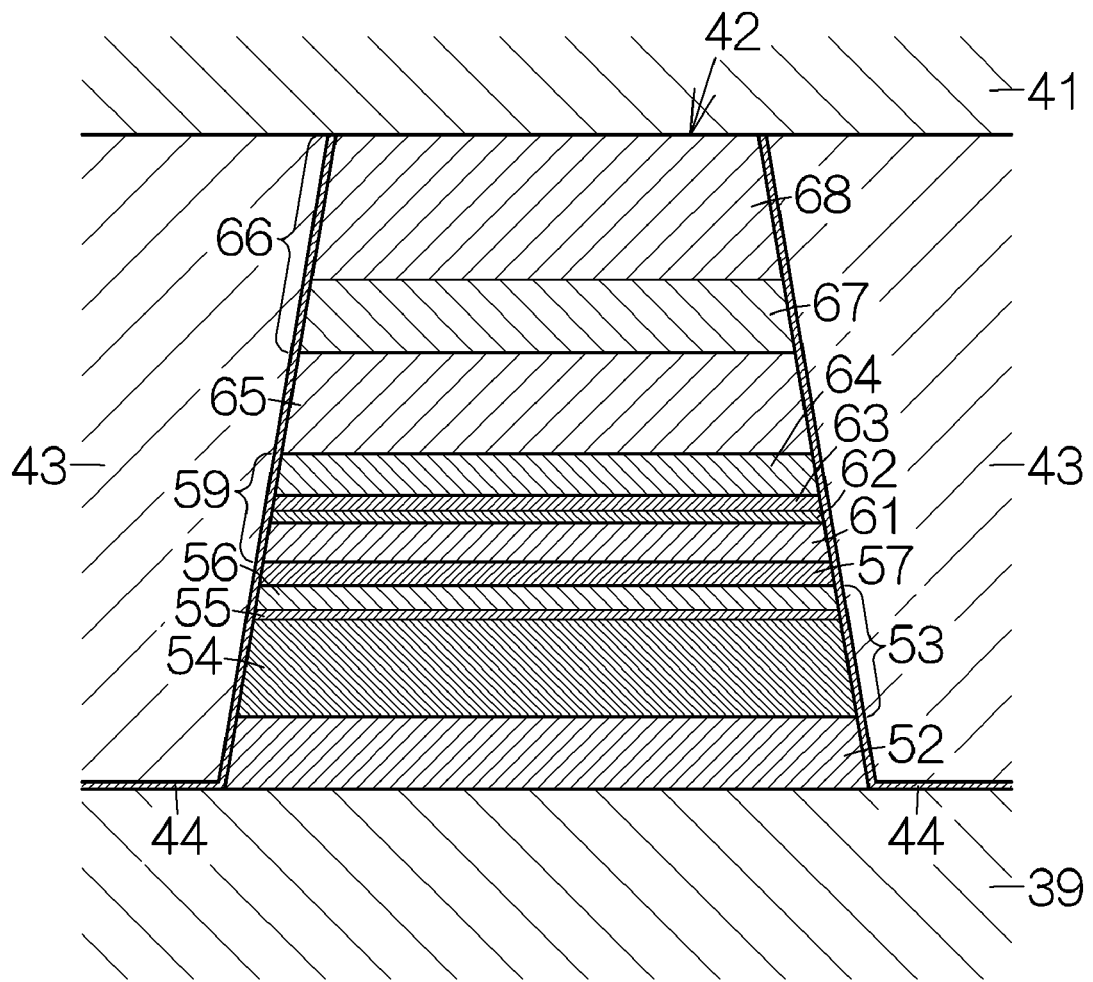
FIG. 5 is an enlarged front view schematically depicting a tunnel-junction magnetoresistive film.

FIG. 5 schematically depicts the tunnel-junction magnetoresistive film 42 according to a specific embodiment. The tunnel-junction magnetoresistive film 42 has a so-called top type multilayered structure. The tunnel-junction magnetoresistive film 42 includes an underlayer 52 extending over the lower electrode 39. The underlayer 52 is made of Ta (tantalum), for example. The underlayer 52 has an amorphous structure. The thickness of the underlayer 52 is set at 3.0 nm, for example.

A free magnetization layer, namely a free layer 53, is overlaid on the surface of the underlayer 52. The free layer 53 is a ferromagnetic layer. Here, the free layer 53 is a multilayered body including an NiFe layer 54, a Ta layer 55 and a CoFeB layer 56, overlaid on the underlayer 52 in this sequence. The thickness of the NiFe layer 54 is set at 4.0 nm. The thickness of the Ta layer 55 is set at 0.4 nm. The thickness of the CoFeB layer 56 is set at 2.0 nm. The free layer 53 is configured to change the direction of the magnetization under the influence of an external magnetic field. The aforementioned magnetic domain controlling films 43 serve to establish a unified single magnetization in a specific direction in the free layer 53.

A tunnel barrier layer 57 is overlaid on the surface of the free layer 53. The tunnel barrier layer 57 is made of an electrically-insulating material. Here, the tunnel barrier layer 57 is made of MgO (magnesium oxide). The thickness of the tunnel barrier layer 57 is set equal to or smaller than 1.0 nm, for example.

A fixed magnetization layer 59 is overlaid on the surface of the tunnel barrier layer 57. The fixed magnetization layer 59 is a multilayered body including a reference layer 61, a crystal layer 62, a non-magnetic layer 63 and a pinned layer 64, overlaid on the tunnel barrier layer 57 in this sequence. The reference layer 61 has an amorphous structure. The reference layer 61 is made of an amorphous alloy containing Co and Fe. Here, the reference layer 61 is made of CoFeB. The thickness of the reference layer 61 is set in a range from 1.6 nm to 2.0 nm. Here, the thickness of the reference layer 61 is set at 1.6 nm. The crystal layer 62 is made of a crystalline alloy containing Co and Fe. Here, the crystal layer 62 is made of CoFe. Crystal grains are established in the crystal layer 62. The thickness of the crystal layer 62 is set at 0.5 nm.

The non-magnetic layer 63 is made of a non-magnetic material. Crystal grains are established in the non-magnetic layer 63. The crystal grains of the non-magnetic layer 63 correspondingly grow from those of the crystal layer 52, respectively. Here, the non-magnetic layer 63 is made of Ru (ruthenium). The thickness of the non-magnetic layer 63 is set at 0.65 nm. The pinned layer 64 is a ferromagnetic layer. Here, the pinned layer 64 is made of CoFe (cobalt iron). The thickness of the pinned layer 64 is set at 1.7 nm, for example. The reference layer 61 in combination with the pinned layer 64 and the non-magnetic layer 63 establishes a synthetic ferri structure. Exchange coupling is thus established between the pinned layer 64 and the reference layer 61. The exchange coupling serves to fix the magnetization of the reference layer 61 in the direction antiparallel to the magnetization of the pinned layer 64.

A pinning layer 65 is overlaid on the surface of the fixed magnetization layer 59. The pinning layer 65 is an antiferromagnetic layer. Here, the pinning layer 65 is made of an IrMn (iridium manganese) alloy. The thickness of the pinning layer 65 is set at 7.0 nm, for example. Exchange coupling is established between the pinned layer 64 and the pinning layer 65. The exchange coupling serves to fix the magnetization of the pinned layer 64 in a predetermined direction.

A capping layer 66 is overlaid on the surface of the pinning layer 65. The capping layer 66 is made of a non-magnetic metallic material, for example. Here, the capping layer 66 includes a Ta layer 67 and a Ru layer 68, overlaid on the pinning layer 65 in this sequence. The thickness of the Ta layer 67 is set at 5.0 nm, for example. The thickness of the Ru layer is set at 10.0 nm, for example. The aforementioned upper electrode 41 is overlaid on the capping layer 66.

The tunnel-junction magnetoresistive film 42 has the top type multilayered structure. Since the tunnel barrier layer 57 is located below the pinning layer 65 in the top type multilayered structure, the tunnel barrier film 57 is released from the effect of unevenness of the pinning layer 65. Moreover, the crystal layer 62 is sandwiched between the reference layer 61 and the non-magnetic layer 63. The crystal grains of the non-magnetic layer 63 have grown from those of the crystal layer 62, respectively. Epitaxial relationship is established. A sufficient crystal growth is realized in the non-magnetic layer 63. As a result, the magnetic coupling of a sufficient intensity is established between the reference layer 61 and the pinned layer 64. The magnetic coupling force serves to prevent deterioration in a resistance to the external magnetic field even in the top type multilayered structure.

Next, a brief description will be made on a method of making the read element 38 and the write element 45. An $Al_2O_3$—TiC substrate is first prepared. A first $Al_2O_3$ film is formed on the surface of the $Al_2O_3$—TiC substrate. Sets of the read element 38 and the write element 45 are formed on the first $Al_2O_3$ film for the respective flying head sliders 22. The write element 45 may be formed in a conventional manner. After the sets of the read element 38 and the write element 45 have been formed, a second $Al_2O_3$ film is formed on the surface of the $Al_2O_3$—TiC substrate. The first and second $Al_2O_3$ films form the head protection film 26. The individual flying head slider 22 is cut out of the $Al_2O_3$—TiC substrate.

Figure 6:
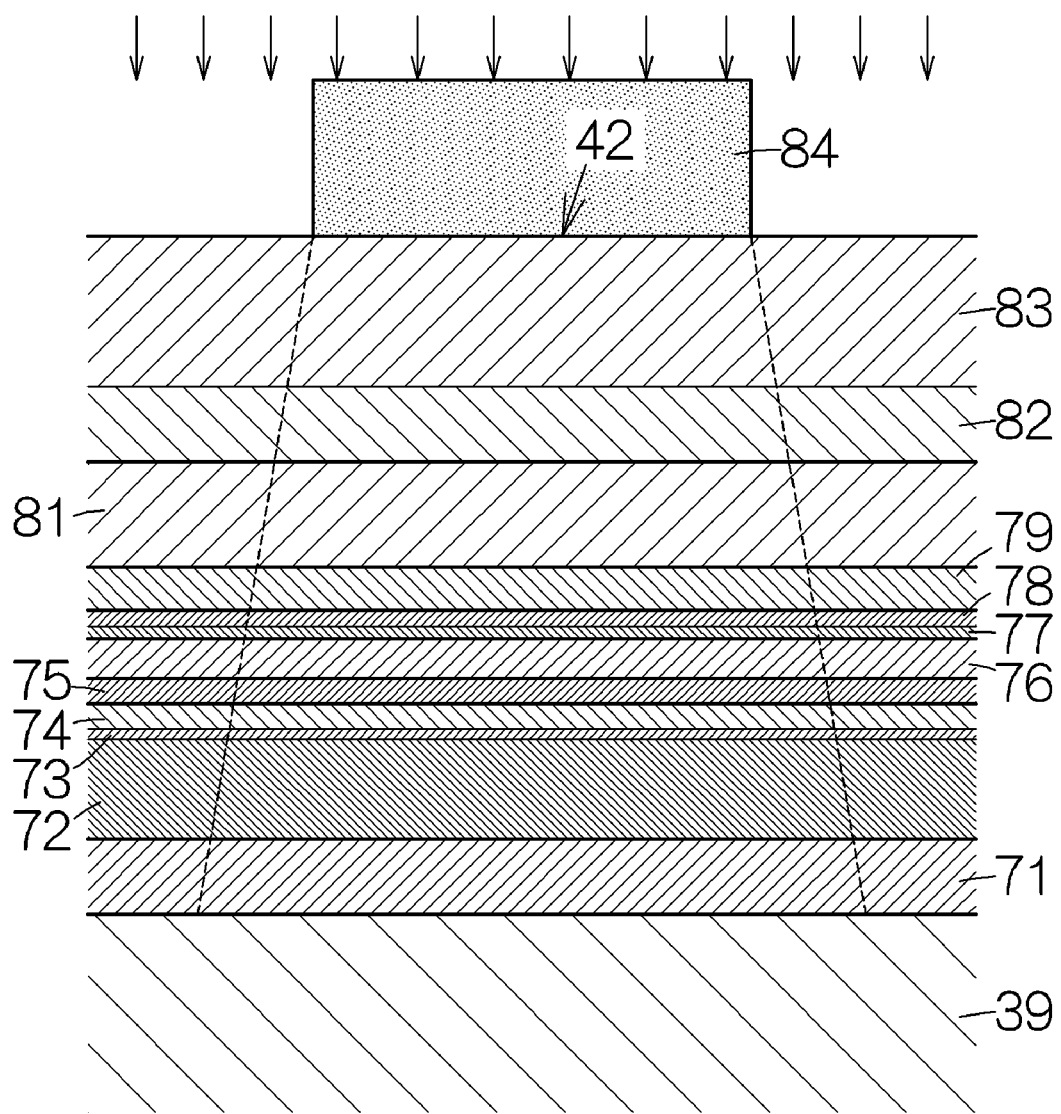
FIG. 6 is a view schematically depicting a process of making the tunnel-junction magnetoresistive film.

Next, a detailed description will be made on a method of making the read element 38. The lower electrodes 39 are formed on the first $Al_2O_3$ film at predetermined positions. Sputtering is employed to form the lower electrodes 39, for example. The lower electrodes 39 are formed in a predetermined shape. As depicted in FIG. 6, a Ta film 71, a NiFe film 72, a Ta film 73, a CoFeB film 74, a MgO film 75, a CoFeB film 76, a CoFe film 77, a Ru film 78, a CoFe film 79, an IrMn film 81, a Ta film 82 and a Ru film 83 are formed in this sequence on the individual lower electrode 39. Sputtering is employed to form the films 71-83, for example. The films 71-83 are then subjected to heat treatment process in a magnetic field of 2T or larger. The heat treatment process includes application of heat at 300 degrees Celsius for four hours. In this manner, a unidirectional anisotropy field is established in each of the CoFe film 79 and the IrMn film 81.

Photolithography technique is then utilized to shape the tunnel-junction magnetoresistive films 42 out of a multilayered body of the Ta film 71, the NiFe film 72, the Ta film 73, the CoFeB film 74, the MgO film 75, the CoFeB film 76, the CoFe film 77, the Ru film 78, the CoFe film 79, the IrMn film 81, the Ta film 82 and the Ru film 83. Patterned photoresist films 84 are formed on the exposed surface of the uppermost layer, namely the Ru film 83. Ion milling is then effected. The patterned photoresist films 84 are used as a mask. The multilayered body is removed outside the contours of the patterned photoresist films 84. The surface of the lower electrode 39 is thus exposed around the patterned photoresist films 84.

The insulating film 44 is then formed on the $Al_2O_3$—TiC substrate to have the thickness in a range from 3.0 nm to 10.0 nm. Here, an $Al_2O_3$ film is formed, for example. Sputtering is employed to form the insulating film 44. $Al_2O_3$ is deposited on the photoresist film 84 and the lower electrode 39. A film material for the magnetic domain controlling films 43 is then formed on the insulating film 44. Sputtering is employed to form the film material. Here, a CoCrPt film is formed. The CoCrPt film surrounds the tunnel-junction magnetoresistive films 42. Lift-off process is effected to remove the insulating film 44 and the CoCrPt film from the surfaces of the tunnel-junction magnetoresistive films 42. In other words, the patterned photoresist films 84 are removed from the surfaces of the tunnel-junction magnetoresistive films 42, respectively.

The surfaces of the CoCrPt films are subjected to polishing and flattening process. Chemical mechanical polishing (CMP) is employed for the polishing and flattening process. The surfaces of the capping layer 66 and the magnetic domain controlling films 43 in the individual read element 38 are leveled to a continuous flat surface. The upper electrodes 41 are formed on the continuous surfaces. Sputtering is employed to form the upper electrodes 41, for example. The individual upper electrode 41 is formed in a predetermined shape. The magnetic domain controlling films 43 are subjected to heat treatment process in a magnetic field. The magnetic domain controlling films 43 are magnetized in a predetermined direction. The read elements 38 are in this manner produced. An insulating film is then formed on the read elements 38. The write elements 45 are formed on the insulating film. The write elements 45 may be produced in a conventional manner.

The inventors have examined differences between the bottom type multilayered structure and the top type multilayered structure. The inventors prepared a specific example of the top type multilayered structure (hereinafter "top type example") and a specific example of the bottom type multilayered structure (hereinafter "bottom type example"). Here, the production process was terminated prior to the formation of the tunnel barrier layer in the top type example and the bottom type example. The top type example included a Ta film of 5.0 nm thickness as an underlayer and a multilayered body as a free magnetization layer, including a NiFe film of 4.0 nm thickness, a Ta film of 0.3 nm thickness and a CoFeB film of 2.0 nm thickness. The bottom type included a Ta film of 5.0 nm thickness and a Ru film of 1.7 nm thickness, in combination as an underlayer, an IrMn film of 7.0 nm thickness as a pinning layer, a CoFe film of 1.7 nm thickness as a pinned layer, a Ru film of 0.7 nm thickness as a non-magnetic layer, and a CoFeB film of 1.8 nm thickness as a reference layer, formed in this sequence on an $Al_2O_3$—TiC substrate.

An atomic force microscope (AFM) was utilized to observe the surface roughness Ra of the CoFeB films of the top type example and the bottom type example. The measurement revealed that the CoFeB film of the top type had the surface roughness Ra equal to 0.13 nm. The measurement also revealed that the CoFeB film of the bottom type example had the surface roughness Ra equal to 0.17 nm. It has been demonstrated that the unevenness of the tunnel barrier layer was reduced in the top type example as compared with in the bottom type example. This is considered to result from the IrMn film formed as a pinning layer below the CoFeB film in the bottom type example. Accordingly, a tunnel barrier layer can relatively be flattened in the top type example. This contributes to a reduction in the thickness of the tunnel barrier layer.

Figure 7:
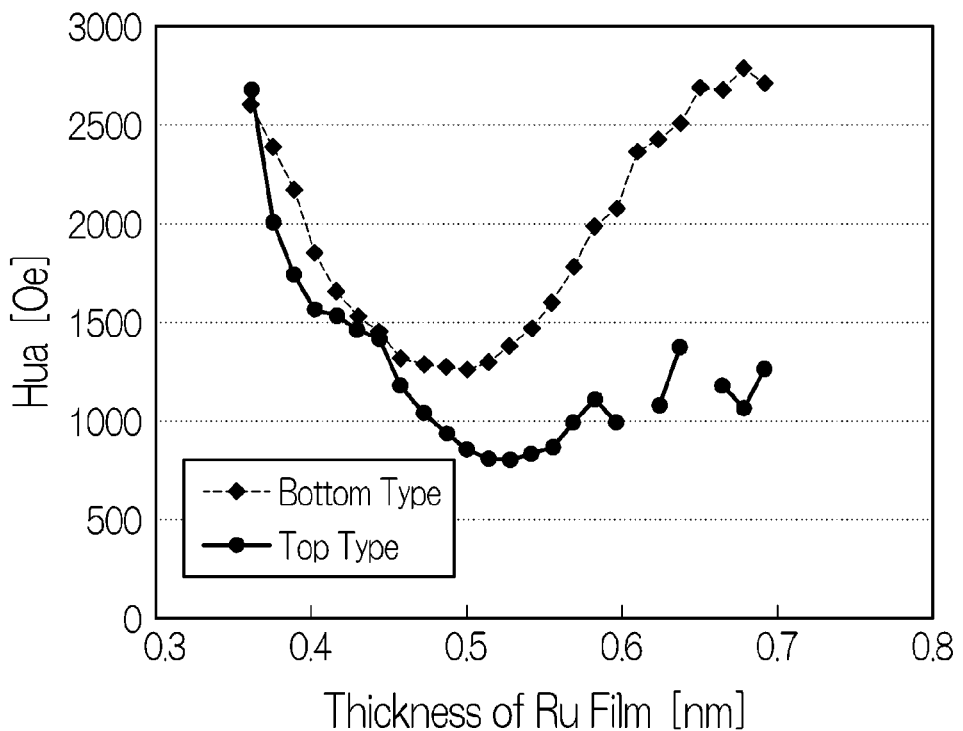
FIG. 7 is a graph specifying the relationship between the thickness of a non-magnetic layers and the unidirectional anisotropy magnetic field.

Next, the inventors have observed variation in the unidirectional anisotropy magnetic field Hua in response to variation in the thickness of the non-magnetic layer 63. The inventors prepared a specific example of the top type multilayered structure (hereinafter "top type example") and a specific example of the bottom type multilayered structure (hereinafter "bottom type example"). The top type example included a Ta film of 3.0 nm thickness as an underlayer, a multilayered body as a free layer, a MgO film of 1.0 nm thickness as a tunnel barrier layer, a multilayered body as a fixed magnetization layer, an IrMn film of 7.0 nm thickness as a pinning layer, and a capping layer, formed in this sequence on an Al$_2$O$_3$—TiC substrate. The multilayered body as a free layer included a NiFe film of 4.0 nm thickness, a Ta film of 0.3 nm thickness and a CoFeB film of 2.0 nm thickness, formed in this sequence. The multilayered body as a fixed magnetization layer included a CoFeB film of 1.8 nm thickness, a Ru film as a non-magnetic layer and a CoFe film of 1.7 nm thickness, formed in this sequence. The bottom type example included a Ta film of 3.0 nm thickness and a Ru film of 2.0 nm thickness, in combination as an underlayer, an IrMn film of 7.0 nm thickness as a pinning layer, a CoFe film of 1.7 nm thickness as a pinned layer, a Ru film as a non-magnetic layer, a CoFeB film of 1.8 nm thickness as a reference layer, a MgO film of 1.0 nm thickness as a tunnel barrier layer, a multilayered body as a free layer, including a CoFeB film of 2.0 nm thickness, a Ta film of 0.3 nm thickness, and a NiFe film of 4.0 nm thickness, and a capping layer, formed in this sequence on an Al$_2$O$_3$—TiC substrate. The unidirectional anisotropy magnetic field Hua was calculated in response to variations in the thickness of the non-magnetic layer, namely the Ru film. As depicted in FIG. 7, it has been demonstrated that the unidirectional anisotropy magnetic field Hua is reduced in the top type example as compared with in the bottom type example when the thickness of the Ru film is set equal to 0.5 nm or larger, for example.

Figure 8:
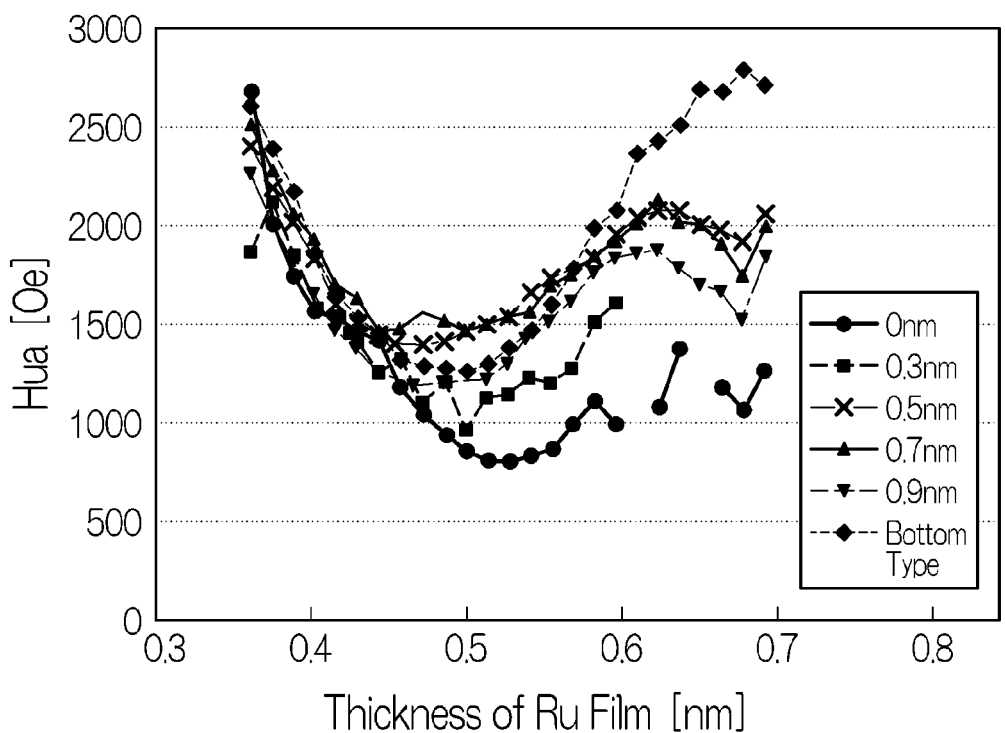
FIG. 8 is a graph specifying the relationship between the thickness of a non-magnetic layer and the unidirectional anisotropy magnetic field.
Figure 9:
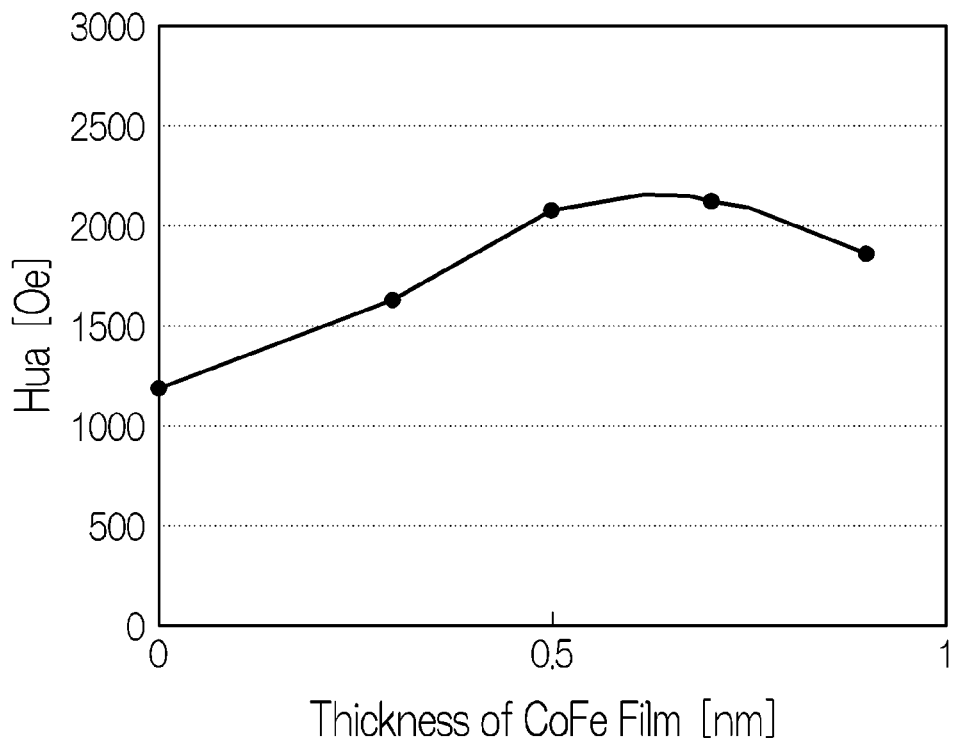
FIG. 9 is a graph specifying the relationship between the thickness of a crystal layer and the unidirectional anisotropy magnetic field.

Next, the inventors have examined the effects of the crystal layer 62. The inventors observed variation in the unidirectional anisotropy magnetic field Hua in response to variation in the thickness of the non-magnetic layer 63 in the same manner as described above. It should be noted that additional specific examples of the top type multilayered structure (hereinafter "additional top type examples"), in addition to the aforementioned specific example of the top type multilayered structure, were prepared. The additional top type examples each included a crystal layer, namely a CoFe film, of a predetermined thickness sandwiched between the CoFeB film and the Ru film. The thickness of the CoFe film was set at 0.3 nm, 0.5 nm, 0.7 nm and 0.9 nm in the individual additional top type examples. As depicted in FIG. 8, it has been demonstrated that the unidirectional anisotropy magnetic field Hua increases in the additional top type examples having the CoFe film as compared with the top type example without the CoFe film, in other words, having the CoFe film of 0 (zero) nm. Accordingly, it has been revealed that the embodiment allows improvement of the unidirectional anisotropy magnetic field Hua, namely the resistance to an external magnetic field, with the assistance of the crystal layer 62. As depicted in FIG. 9, the unidirectional anisotropy magnetic field Hua changes in response to variation in the thickness of the CoFe film in the additional top type examples. In this case, the thickness of the Ru film was set at 0.65 nm. It has been confirmed that the thickness of the CoFe film should preferably be set in a range from 0.3 nm to 0.9 nm, for example.

Next, the inventors have examined variation in the MR ratio in response to variation in the thickness of the reference layer 61. The Zeeman energy can be suppressed to a low level by reducing the thickness of the reference layer 61. The Zeeman energy is represented by the product of the external magnetic field and the magnetic moment. Suppression of the Zeeman energy leads to enhancement of the resistance to the external magnetic field in the fixed magnetization layer 59. A reduction in the thickness of the reference layer 61 results in a reduced magnetoresistance ratio (MR ratio). The output of the read element 38 is reduced. A trade-off relationship is established between the resistance to the external magnetic field and the MR ratio. Accordingly, the inventors measured the minimum thickness of the reference layer 61 based on the examination of changes in the MR ratio.

Figure 10:
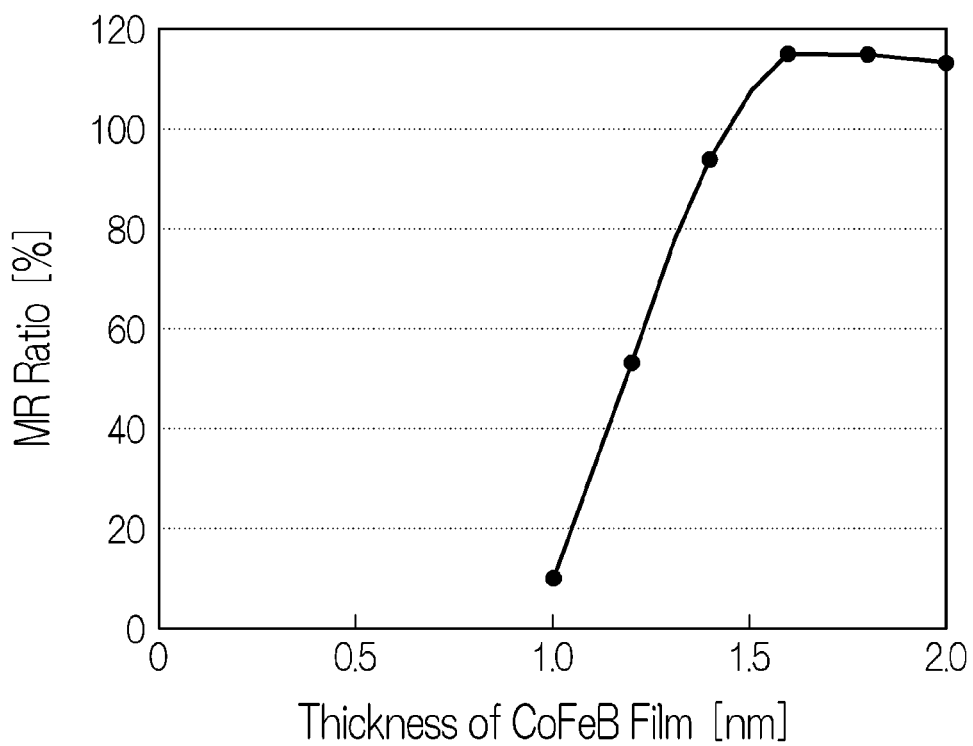
FIG. 10 is a graph specifying the relationship between the thickness of a reference layer and the magnetoresistance (MR) ratio.
Figure 11:
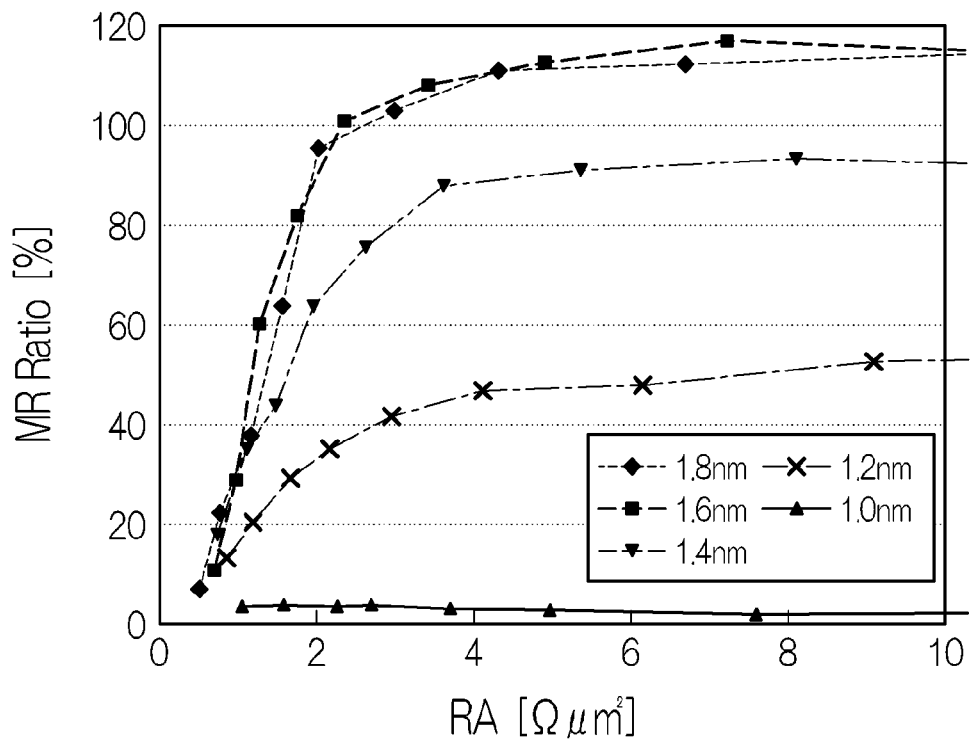
FIG. 11 is a graph specifying the relationship between the electrical resistivity (RA) and the magnetoresistance (MR) ratio.

The tunnel-junction magnetoresistive films 42 according to specific examples were prepared for the examination. The thickness of the reference layer 61, namely the CoFeB film, was adjusted in each of the specific examples. The MR ratio [%] of the tunnel-junction magnetoresistive film 42 was calculated. The electrical resistivity (RA) was set equal to or smaller than 10[Ωμm$^2$]. As depicted in FIG. 10, it has been demonstrated that a remarkable reduction can be observed in the MR ratio when the thickness of the CoFeB film gets smaller than 1.6 nm. It has also been demonstrated that a sufficient MR ratio is maintained when the thickness of the CoFeB film is set in a range from 1.6 nm to 2.0 nm. Next, the RA was adjusted in each of the specific examples. As depicted in FIG. 11, it has been demonstrated that a sufficient MR ratio cannot be maintained when the thickness of the CoFeB film gets smaller than 1.6 nm. According to the aforementioned results, it has been revealed that the minimum thickness of the reference layer 61 is 1.6 nm for realizing both improvement of the resistance to the external magnetic field and an increased output of the read element 38.

Figure 12:
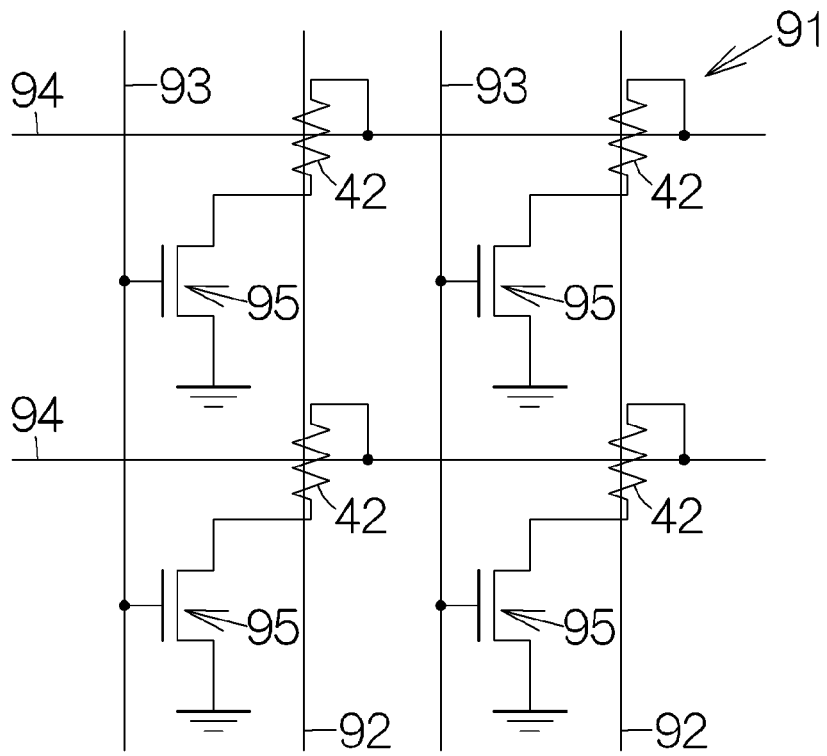
FIG. 12 is a circuit diagram schematically depicting the structure of a magnetic random access memory (MRAM).

FIG. 12 schematically depicts a specific example of a magnetic memory according to an embodiment, namely a magnetic random access memory (MRAM) 91. The magnetic random access memory 91 includes write word lines 92 and read word lines 93 alternately arranged in parallel with one another. Bit lines 94 intersect the write word lines 82 and the read word lines 83. The aforementioned tunnel-junction magnetoresistive film 42 is connected to the individual bit line 94 at the intersection between the bit line 94 and the write word line 92. The tunnel-junction magnetoresistive film 42 is connected to the source of a MOS (Metal Oxide Semiconductor) transistor 95, for example. The drain of the MOS transistor 95 is grounded. The read word line 93 is connected to the gate of the MOS transistor 95. The write word line 92 and the bit line 94 in combination serve as the write element of the embodiment.

In the tunnel-junction magnetoresistive film 42, a composite magnetic field of the write word line 92 and the bit line 94 serves to invert the direction of magnetization of the free layer 53. The composite magnetic field is generated based on electric currents flowing through the write word line 92 and the bit line 94, respectively. The individual tunnel-junction magnetoresistive film 42 can be selected based on the combination of the write word line 92 and the bit word line 94. Binary bit data is in this manner recorded into the tunnel-junction magnetoresistive film 42. Electric current is supplied to the read word line 93 for reading binary bit data. Voltage is applied to the gate of the MOS transistor 95 in response to the supply of the electric current. When the electric current flows through the selected bit line 94, the tunnel-junction magnetoresistive film 42 provides a change in the voltage of the bit line 94. A detector circuit, not depicted, is utilized to detect such a change in the voltage. Binary bit data is in this manner detected.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A magnetoresistive element comprising:
a free layer made of a ferromagnetic material, the free layer configured to change direction of magnetization under an influence of an external magnetic field;
an insulating layer overlaid on the free layer, the insulating layer made of an insulating material;
an amorphous reference layer overlaid on the insulating layer, the amorphous reference layer made of a ferromagnetic material, the amorphous reference layer configured to fix magnetization in a predetermined direction;
a crystal layer overlaid on the amorphous reference layer, the crystal layer containing crystal grains;
a non-magnetic layer overlaid on the crystal layer, the non-magnetic layer containing crystal grains having grown from the crystal grains in the crystal layer; and
a pinned layer overlaid on the non-magnetic layer, the pinned layer configured to fix magnetization in a predetermined direction.

2. The magnetoresistive element according to claim 1, further comprising a pinning layer overlaid on the pinned layer, the pinning layer made of an antiferromagnetic material.

3. The magnetoresistive element according to claim 1, wherein the amorphous reference layer is made of an amorphous alloy containing Co and Fe.

4. The magnetoresistive element according to claim 3, wherein the crystal layer is made of a crystalline alloy containing Co and Fe.

5. A magnetic head comprising:
a magnetoresistive element; and
a write element configured to generate a wiring magnetic field,
wherein the magnetoresistive element including:
a free layer made of a ferromagnetic material, the free layer configured to change direction of magnetization under an influence of an external magnetic field;
an insulating layer overlaid on the free layer, the insulating layer made of an insulating material;
an amorphous reference layer overlaid on the insulating layer, the amorphous reference layer made of a ferromagnetic material, the amorphous reference layer configured to fix magnetization in a predetermined direction;
a crystal layer overlaid on the amorphous reference layer, the crystal layer containing crystal grains;
a non-magnetic layer overlaid on the crystal layer, the non-magnetic layer containing crystal grains having grown from the crystal grains in the crystal layer; and
a pinned layer overlaid on the non-magnetic layer, the pinned layer configured to fix magnetization in a predetermined direction.

6. A storage apparatus comprising:
a storage medium; and
a magnetic head opposed to the storage medium at a distance, the magnetic head performing writing and reading operations for magnetic data on the storage medium,
wherein the magnetic head includes:
a magnetoresistive element; and
a write element configured to generate a wiring magnetic field,
wherein the magnetoresistive element including:
a free layer made of a ferromagnetic material, the free layer configured to change direction of magnetization under an influence of an external magnetic field;
an insulating layer overlaid on the free layer, the insulating layer made of an insulating material;
an amorphous reference layer overlaid on the insulating layer, the amorphous reference layer made of a ferromagnetic material, the amorphous reference layer configured to fix magnetization in a predetermined direction;
a crystal layer overlaid on the amorphous reference layer, the crystal layer containing crystal grains;
a non-magnetic layer overlaid on the crystal layer, the non-magnetic layer containing crystal grains having grown from the crystal grains in the crystal layer; and
a pinned layer overlaid on the non-magnetic layer, the pinned layer configured to fix magnetization in a predetermined direction.

7. A magnetic memory comprising:
a magnetoresistive element; and
a write element configured to apply an external magnetic field to the magnetoresistive element,
wherein the magnetoresistive element including:
a free layer made of a ferromagnetic material, the free layer configured to change direction of magnetization under an influence of an external magnetic field;
an insulating layer overlaid on the free layer, the insulating layer made of an insulating material;
an amorphous reference layer overlaid on the insulating layer, the amorphous reference layer made of a ferromagnetic material, the amorphous reference layer configured to fix magnetization in a predetermined direction;
a crystal layer overlaid on the amorphous reference layer, the crystal layer containing crystal grains;
a non-magnetic layer overlaid on the crystal layer, the non-magnetic layer containing crystal grains having grown from the crystal grains in the crystal layer; and
a pinned layer overlaid on the non-magnetic layer, the pinned layer configured to fix magnetization in a predetermined direction,
wherein the external magnetic field changing direction of magnetization in the free layer.

* * * * *